United States Patent [19]

Yi et al.

[11] Patent Number: 6,100,690
[45] Date of Patent: Aug. 8, 2000

[54] RADIO FREQUENCY COIL FOR MAGNETIC RESONANCE IMAGING APPARATUS

[75] Inventors: Woan Yi, Sungnam; Jung-hoe Kim; Jeong-han Yi, both of Seoul; Dong-heon Kang, Sungnam, all of Rep. of Korea

[73] Assignee: Samsung Electronics Co., Ltd., Suwon, Rep. of Korea

[21] Appl. No.: 08/960,344

[22] Filed: Oct. 29, 1997

[30] Foreign Application Priority Data

Oct. 31, 1996 [KR] Rep. of Korea ............... 96-51438

[51] Int. Cl.⁷ ............................................ G01V 3/00
[52] U.S. Cl. .................. 324/318; 324/322; 324/318; 600/412; 335/296
[58] Field of Search ............................. 324/318, 322; 600/412, 549, 422; 335/296

[56] References Cited

U.S. PATENT DOCUMENTS 5,107,216  4/1992  Yabusaki et al. ............... 324/318

OTHER PUBLICATIONS

Sung–woo Lee et al., "Magnetic Resonance Imaging," Tae-hak Publication Co., Aug. 20, 1994, cover page, and pp. 38–40. (English translation of relevant portion attached.).

D.H. Lee et al. "Development of inside–out probes for both Nuclear Magnetic Resonance Imaging and Nuclear Magnetic Resonance Spectroscopy," *J. of KOSOMBE*, vol. 16, No. 3, 1995, (95–16–3–07), pp. 309–315. (English translation of relevant portion attached.).

Eiichi Fukushima et al., "Expermental Pulse NMR –A Nuts and Bolts Approach," Addison–Wesley Publishing Company, Inc., Advanced Book Program, Reading, Massachusetts, 1981, cover page, and pp. 12–14.

Derek Shaw, "Fourier Transform N.M.R. Spectroscopy," Varian Associates Ltd., Walton–on–Thames, Elsevier Scientific Publishing Company, Amsterdam –Oxford –New York, 1976, cover page, and pp. 128–129.

*Primary Examiner*—Christine K. Oda
*Assistant Examiner*—Brij B. Shrivastav
*Attorney, Agent, or Firm*—Burns, Doane, Swecker & Mathis, L.L.P.

[57] ABSTRACT

In a magnetic resonance imaging apparatus being medical diagnostic equipment for understanding the internal structure of a human body, a radio frequency coil for a magnetic resonance imaging apparatus is provided for transmitting and receiving a magnetic resonance signal for forming a magnetic resonance image of a portion of a human body. The coil has an opening formed by splitting a portion of one turn of the coil into two. Thereby, a radio frequency coil for a vertical magnetic field provides a maximum open area. Therefore, a simple operation or an observation can be made through the opening simultaneously with taking a magnetic resonance image of the affected part. Also, a patient can feel less claustrophobic because they can see out through the opening.

13 Claims, 7 Drawing Sheets

RADIO FREQUENCY COIL FOR MAGNETIC RESONANCE IMAGING APPARATUS

BACKGROUND OF THE INVENTION

1. Field of the Invention

The present invention relates to a radio frequency coil for a magnetic resonance imaging apparatus, which transmits and receives a magnetic resonance signal for forming a magnetic resonance image of a human body in a magnetic resonance imaging apparatus being a medical diagnosis device for understanding the internal structure of a human body.

2. Description of Related Art

As a tomographic method for understanding the internal structure of a human body, there is X-ray computerized tomography (C.T.) using X-rays and magnetic resonance imaging (MRI) using the magnetic resonance signal of an element in a human body. The tomograph using a magnetic resonance (MR) phenomenon has several advantages compared to the X-ray C.T. That is, a magnetic field absolutely harmless to human bodies is used in the MRI method, so long imaging times or frequent examining does no harm to a human body. Also, discrimination of molecules which is not made in the X-ray tomography is possible. Furthermore, a two-dimensional or three-dimensional tomographic image can be obtained at an arbitrary place in an arbitrary direction on X, Y and Z axes. Because of these merits, the MRI has become an indispensable piece of medical imaging equipment.

The MRI apparatus is roughly comprised of a main magnet, coils and a scan processor. The main magnet for forming a strong magnetic field is a permanent magnet, an electromagnet, or a superconducting magnet using a superconductive body whose magnetic field intensity is typically between 0.2 Tesla and 2.0 Tesla (1 Tesla is 10000 gauss magnetic field). Comprising the coil are a gradient magnetic field coil, for making a gradient magnetic field of directions X, Y and Z; a transmit radio frequency coil for making a magnetic resonance (MR) signal by applying energy to an atomic nucleus spin of a human body; and a receive radio frequency coil for receiving a magnetic resonance (MR) signal emitted from a human body. The scan processor includes a spectrometer for demodulating and greatly amplifying a received magnetic resonance signal, a controller for controlling the operation of each coil, and a processor for converting a received analog signal into digital data and performing a Fourier transformation from frequency data to data on planes X and Y.

In the magnetic resonance imaging apparatus structured as above, in the case that a magnet for forming a vertical-direction magnetic field, having a low magnetic field of 0.5 tesla or less, is used as a coil for receiving a magnetic resonance signal emitted from a human body, it is common to use a solenoid coil. FIG. 1 shows a conventional 3-turn coil as the above-described solenoid coil. The case of carrying out an operation simultaneously with taking a magnetic resonance image is becoming more common. Since the turns of the conventional radio frequency coil shown in FIG. 1 are disposed at equal intervals, it is difficult to gain access to the diseased part of a human body within the radio frequency coil to operate thereon, or to observe the diseased part. Also, patient's eyes are closed when the patient's head is examined, so the patient feels uncomfortable. FIG. 2 shows a human's head within a receive radio frequency coil during head examining. As shown in FIG. 2, no problem occurs when an operation is performed near the upper opening of the radio frequency coil. However, in case that an operation is carried out on the other portions of the radio frequency coil, access is obstructed by the coil. Thus, it is difficult to obtain a magnetic resonance image simultaneously with conducting an operation.

SUMMARY OF THE INVENTION

To solve such a problem, it is an object of the present invention to provide a radio frequency coil installed in a magnetic field area of a main magnet for forming a vertical magnetic field, for conducting a simple operation on a diseased part or observing the diseased part, simultaneously with taking a magnetic resonance image of the diseased part.

To accomplish the above object, there is provided a radio frequency coil for a magnetic resonance imaging apparatus providing a solenoid, wherein a turn of the solenoid is split into two branches which are spread apart at a part of the turn to create at least one separation section having an open area.

According to the present invention, it is preferable that the turn can be comprised of a strand or a plurality of strands. Preferably, the open area in the separation section includes an opening through which a diseased portion of a body can be operated on or observed. Also, preferably, the turn in the separation section forms a shape symmetrical about the axis of the original position of the turn in the unseparated section.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

Figure 3:
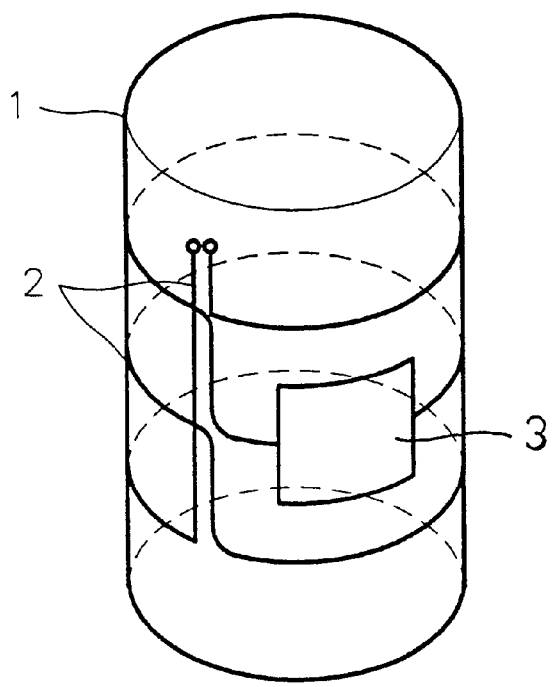
FIG. 3 shows the structure of a radio frequency coil for a magnetic resonance imaging apparatus, according to the present invention.

The present invention is characterized by the structure of a radio frequency coil, among the components of an MRI apparatus, for receiving a magnetic resonance signal emitted from a human body. In particular, proposed is the structure of a radio frequency coil allowing interventional surgery that an operation can be carried out simultaneously with obtaining a magnetic resonance image in the magnetic field region of a main magnet for forming a vertical magnetic field. That is, the radio frequency coil for a magnetic resonance imaging apparatus according to the present invention, as shown in FIG. 3, is a transmit radio frequency coil for exciting a receive radio frequency coil for detecting a magnetic resonance signal or a nuclear spin of a sample. The coil of FIG. 3 has a structure in which in a partial section of the coil, one turn of the coil is split into two branches, and the two branches again combine into one turn. An open area, i.e., a coil open portion 3, is created between the two branches.

A detailed description will be given of a radio frequency coil for a magnetic resonance imaging apparatus according to the present invention, referring to FIG. 3.

Figure 5:
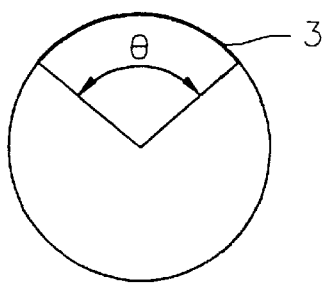
FIG. 5 is a plan view of the radio frequency coil of FIG. 3.
Figure 6:
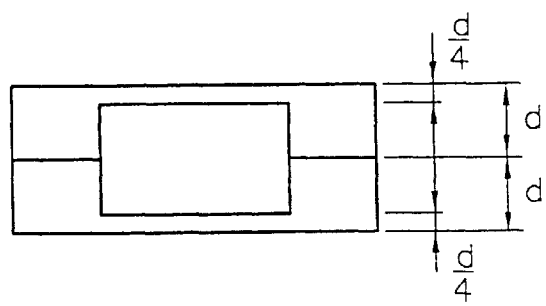
FIG. 6 is a front view of the radio frequency coil of FIG. 3.

As shown in FIG. 3, the radio frequency coil for a magnetic resonance imaging apparatus according to the present invention includes a coil support 1, and a solenoid coil 2 having the above-described coil open portion 3. The coil support 1 is a non-magnetic body and made of a non-conductive material such as acrylic, plastic or fiberglass-reinforced plastic (FRP). The coil 2 is made of a high frequency coil material, i.e., a copper pipe or a copper plate, and has three turns. The coil open portion 3 is shaped in an open rectangle formed by dividing a portion of the middle coil into two. The size of the coil open portion is set within a range of about 120°, indicated by an angle θ about a central axis as shown in FIG. 5. In the rectangular open section, it is optimal that the interval between the two divided conductors at the widened coil portion and the adjacent conductors is between ⅓ of a normal coil interval d and ¼ thereof as shown in FIG. 6. In the present invention, the interval is set to be d/4.

Figure 4:
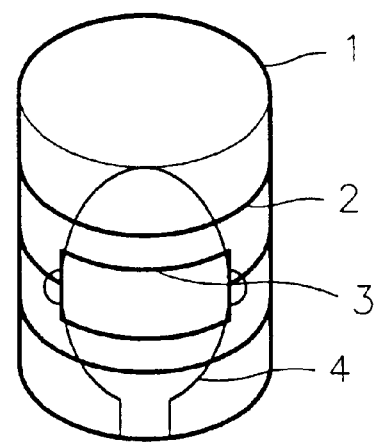
FIG. 4 shows the position of a human's head inserted in the solenoid coil of FIG. 3 when examining the head.

To see the state of an inserted head when the magnetic resonance imaging apparatus using the open radio frequency coil photographs the head, a diseased part of the eyes, nose or the back of the head is placed at the open portion 3 as shown in FIG. 4. Thus, it is easy to conduct a simple operation or observe the diseased part by eye while taking an image.

Figure 7:
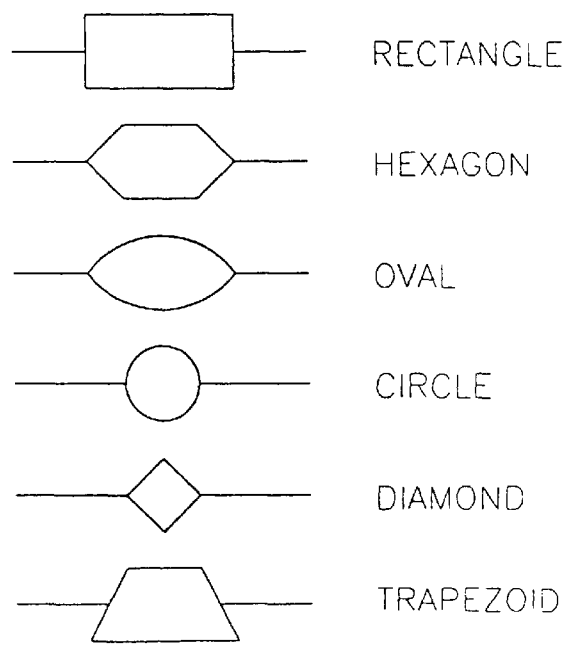
FIG. 7 shows various examples of the shape of the radio frequency coil separation section of FIG. 3.
Figure 8:
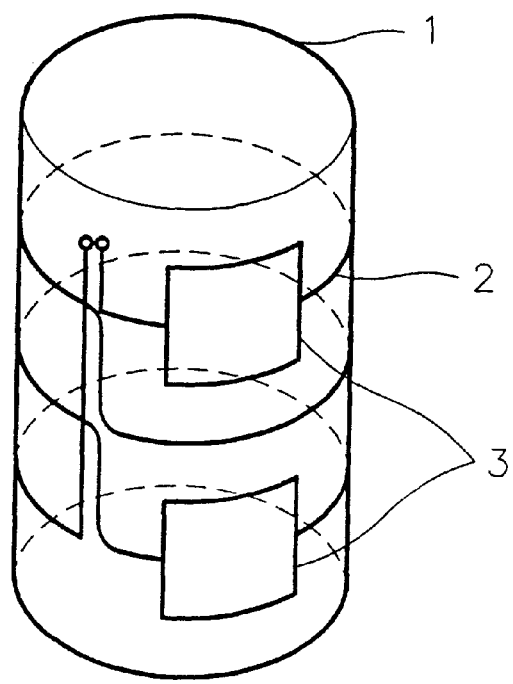
FIG. 8 shows the structure of another radio frequency coil for a magnetic resonance imaging apparatus according to the present invention.
Figure 9:
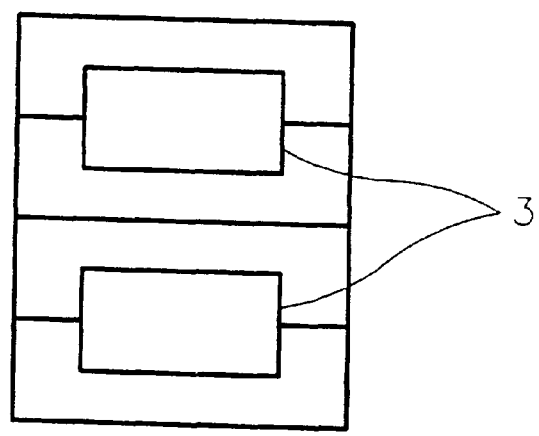
FIG. 9 is a front view of the radio frequency coil of FIG. 8.

The open portion 3 of the radio frequency coil can be formed in various shapes such as a rectangle, a hexagon, a circle, an oval, a diamond, or a trapezoid, as shown in FIG. 7. Also, the number of coil open portions can be two or more as shown in FIGS. 8 and 9.

The magnetic resonance image apparatus having such an open radio frequency coil operates as follows.

In an MRI apparatus having a main magnet whose magnetic field intensity is 0.5 tesla or less, as the number of turns of a radio frequency coil for receiving a magnetic resonance signal from a human body increases, the intensity of the received signal increases. Accordingly, a signal-to-noise ratio (SNR) is enhanced to thus obtain clear pictures. However, as the number of turns of the coil increases, the inductance of the coil increases. Therefore, as a resonance frequency (ω) is determined by an equation $\omega=1/(2\sqrt{LC})$ (the desired value of ω depends on the magnetic field intensity of a main magnet), the capacitance C must be reduced according to the increase of inductance L due to the increase in the number of turns, to maintain the necessary resonance frequency. However, there is a limit to reducing the capacitance C, and the increase in inductance acts as a problem in tuning. That is, for a coil in a low magnetic field, 2 to 4 turns is the allowable range. When the magnetic field intensity of the magnetic resonance imaging apparatus is determined, the allowable range becomes further narrower. The present invention describes a radio frequency coil for a low magnetic field having three turns, as an embodiment. In particular, in the case of a coil having 3 turns, for accommodating only a head, a received signal is large and the SNR is high. However, if the middle turn of the radio frequency coil is not split but is closed as in the prior art, this middle turn makes it difficult to carry out an operation or make an observation simultaneously with taking an image. To solve this problem, the position and shape of turns disposed at equal intervals are changed, by splitting the middle turn to make an open region (window). Thus, an operation can be carried out through the open region. However, in this case, the alteration of the middle turn causes deterioration in the uniformity of a spacial reception sensitivity in a magnetic field, thus requiring a special attention. That is, the equidistant turn spacing most uniformly receives the magnetic field. However, the spacing must be altered. It must be done so that a great degradation of the uniformity of reception sensitivity does not occur. Thus, the formation of a magnetic resonance image must not be hindered by such alteration.

Experimental data, which shows that the open region does not impede the magnetic resonance image formation, is presented through the following embodiment.

Figure 1:
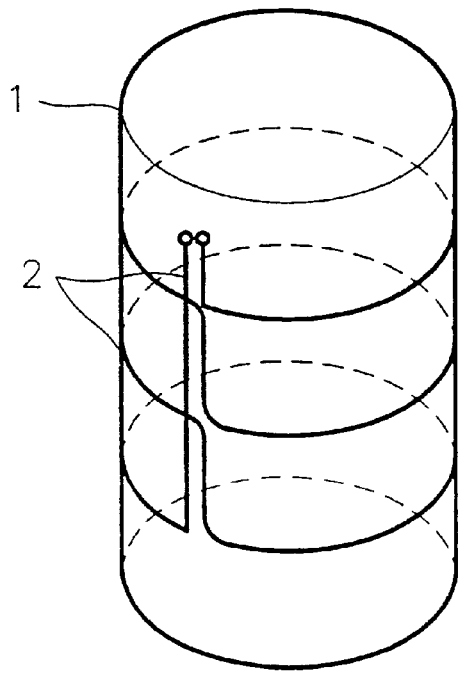
FIG. 1 shows the structure of a conventional closed (solenoid) radio frequency coil.
Figure 2:
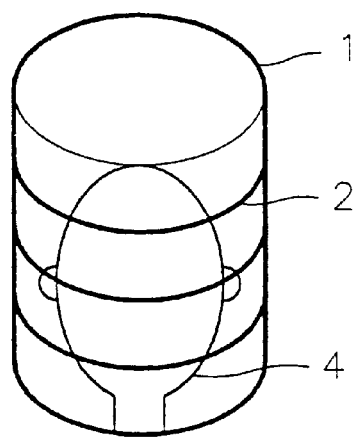
FIG. 2 shows the position of a human's head inserted in the solenoid coil of FIG. 1 when examining the head.
Figure 10:
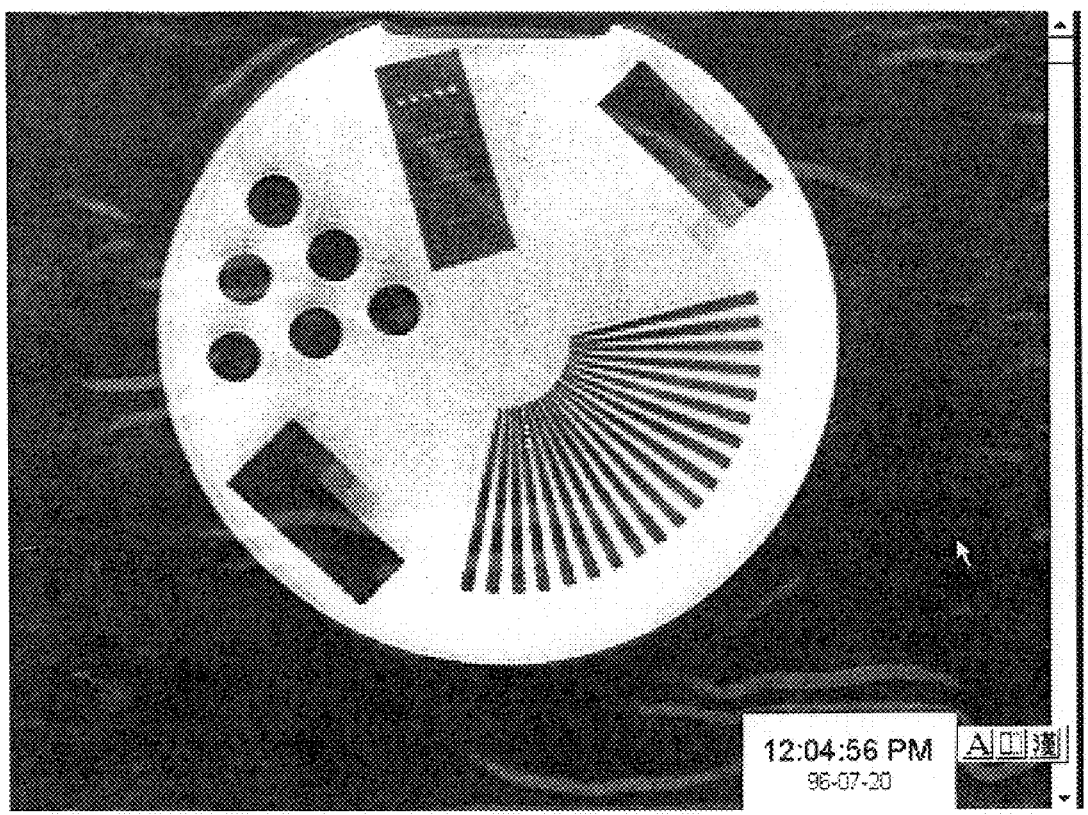
FIG. 10 is a magnetic resonance image obtained by using the radio frequency coil for a magnetic resonance imaging apparatus of FIG. 1.
Figure 11:
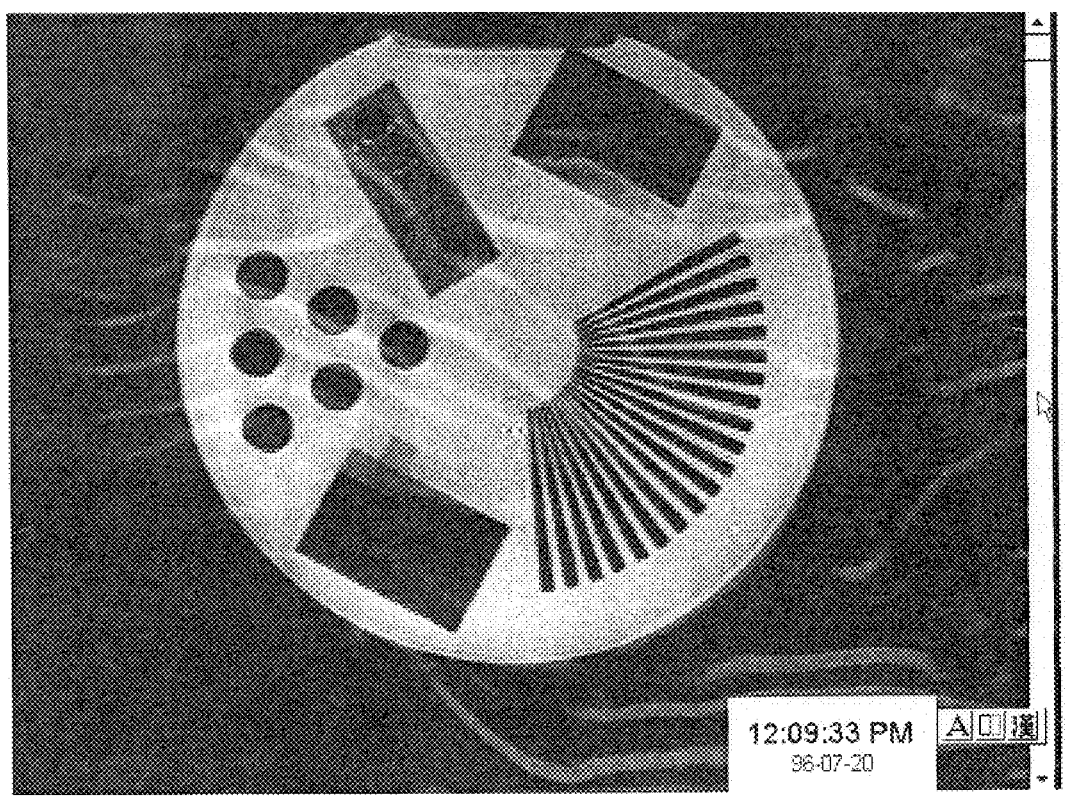
FIG. 11 is a magnetic resonance image obtained by using the radio frequency coil for a magnetic resonance imaging apparatus of FIG. 3.

FIGS. 10 and 11 show magnetic images of a phantom obtained by magnetic resonance imaging apparatuses using the radio frequency coils of FIGS. 1 and 3, respectively. The diameter of the coils used in this image experiment is 25 cm, and the turn spacing is 6.5 cm. A phantom as an image object is of 22 cm diameter and 12 cm thickness. A magnetic resonance signal which is received by a radio frequency coil is provided by 256×256 point data to the scan processor and becomes an image. A magnetic signal is measured by comparing a mean value and a standard deviation from 20×20 point data in an arbitrary section of an image area. When an image (see FIG. 10) obtained by using a conventional radio frequency coil is compared with an image (see FIG. 11) obtained by using the radio frequency coil of the present invention, most section of image has a mean value 1118 and a standard deviation 18, which are similar to those obtained by the radio frequency coil according to the present invention, over the entire region of the conventional radio frequency coil. However, the radio frequency coil of the present invention has results which are a little different from the results in the conventional coil, in sections A, B, C and D shown in FIG. 12. These values are presented in Table 1.

TABLE 1

|  | total mean | A region | B region | C region | D region |
| --- | --- | --- | --- | --- | --- |
| conventional structure | 1118/18 | 1163/20 | 1135/19 | 1158/19 | 1102/18 |
| structure of the present invention | 1116/18 | 1245/23 | 1084/18 | 1247/22 | 1092/19 |

Figure 12:
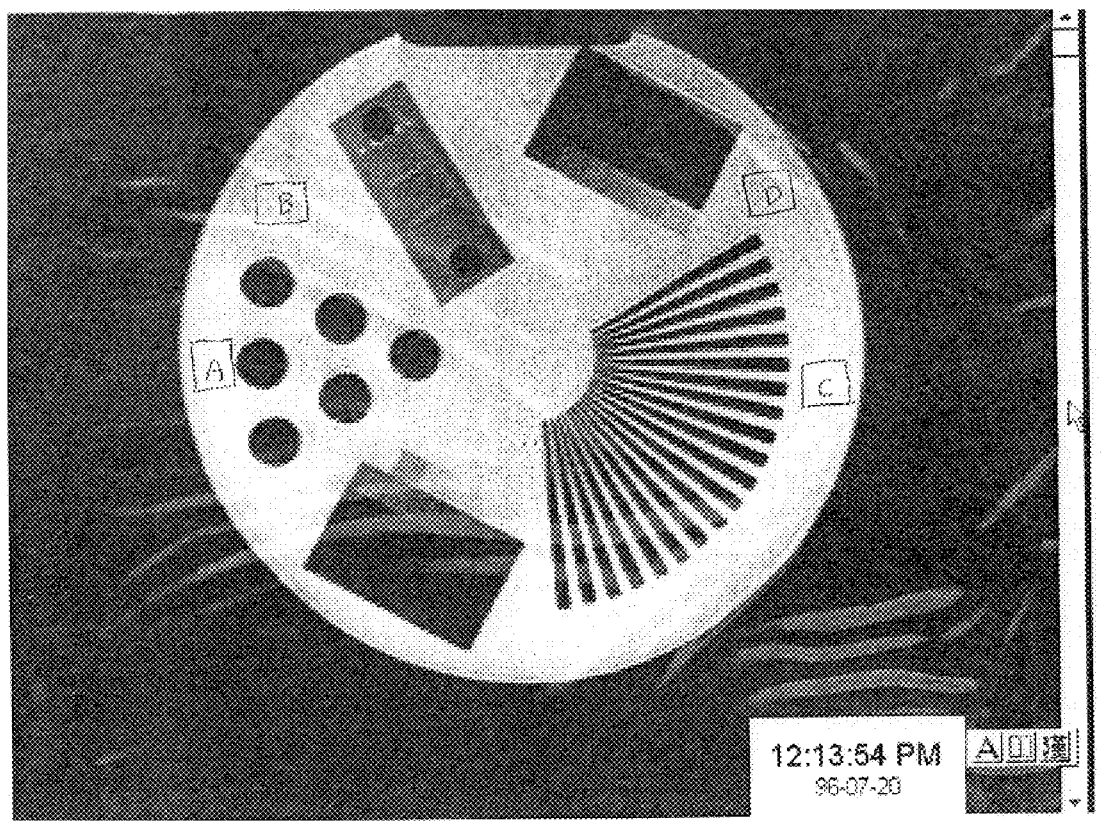
FIG. 12 shows reference positions on a magnetic resonance image, and a coil opening position.

Referring to the results of Table 1 and FIG. 12, there is no big difference in the overall size of the magnetic signal and its deviation, between the conventional structure and the structure according to the present invention. On the other hand, the regions A and C of the present invention appear a little brighter (larger signal) than the mean, and the regions B and D appear a little darker than the mean. However, when the difference is expressed as a percentage, uniformity of the magnetic resonance signal is in the range of about 10%, and the area of the non-uniform region is about 5% of the total area. Also, the uniformity of the central portion is almost the same as that of the image obtained by the conventional radio frequency coil. In practice, the magnetic resonance image is obtained at the center of the coil, so the uniformity at the outer wall does not matter much. Furthermore, since there is are variations in uniformity even in the image of the conventional structure, it is not a serious problem in analyzing a magnetic image.

As described above, the radio frequency coil for a magnetic resonance imaging apparatus according to the present invention has an open structure formed by splitting a portion of one turn of the coil into two branches. Thus, the radio frequency coil for a vertical magnetic field provides the maximum open area. Therefore, a simple operation or an observation can be made through the open portion, simultaneously with taking a magnetic resonance image of an affected part. Also, a patient can feel less claustrophobic because they can see out through the open portion while the magnetic resonance image is taken.

What is claimed is:

1. A radio frequency coil for a magnetic resonance imaging apparatus providing a solenoid, wherein a turn of said solenoid is split into two branches which are spread apart at a part of the turn to create at least one separation section having an open area, wherein said open area in said separation section includes an opening through which a diseased portion of a body can be operated on or observed, wherein the turn in said separation section form a shape symmetrical about the axis of the original position of the turn in the unseparated section, and wherein said turn in said separation section form any one shape selected from the group consisting of a rectangle, a hexagon, an oval, a circle and a diamond.

2. A radio frequency coil for a magnetic resonance imaging apparatus providing a solenoid, wherein a turn of said solenoid is split into two branches which are spread apart at a part of the turn to create at least one separation section having an open area, wherein said open area in said separation section includes an opening through which a diseased portion of a body can be operated on or observed, and wherein the shape of said turn in said separation section is a trapezoid formed such that the two separated branches are of equal length.

3. A radio frequency coil for a magnetic resonance imaging apparatus, said coil comprising:

a solenoid having a plurality of turns of conductive material, wherein at least one turn of said solenoid is split into two branches which are spaced apart at a part of the turn to create at least one solenoid turn separation portion.

4. A radio frequency coil in accordance with claim 3, further comprising a coil support having at least one open portion corresponding to said at least one solenoid turn separation portion.

5. A radio frequency coil in accordance with claim 3, wherein said at least one turn includes a plurality of conductive strands.

6. A radio frequency coil in accordance with claim 3, wherein said spacing of said branches of said at least one solenoid turn separation portion is greater than spacing between adjacent solenoid turns not at said at least one solenoid turn separation portion.

7. A radio frequency coil in accordance with claim 3, wherein said branches of said at least one solenoid turn separation portion form a shape symmetrical about the axis of the original position of the turn in the unseparated section.

8. A radio frequency solenoid for a magnetic resonance imaging apparatus, said solenoid comprising a plurality of turns of conductive material, wherein at least one turn of said solenoid is split into two branches which are spaced apart at a part of the turn to create at least one solenoid turn separation portion.

9. A radio frequency solenoid in accordance with claim 8, wherein said at least one turn includes a plurality of conductive strands.

10. A radio frequency solenoid in accordance with claim 8, wherein said spacing of said branches of said at least one solenoid turn separation portion is greater than spacing between adjacent solenoid turns not at said at least one solenoid turn separation portion.

11. A radio frequency solenoid in accordance with claim 8, wherein said branches of said at least one solenoid turn separation portion form a shape symmetrical about the axis of the original position of the turn in the unseparated section.

12. A radio frequency solenoid in accordance with claim 8, wherein said branches of said at least one solenoid turn separation portion form any one shape selected from the group consisting of a rectangle, a hexagon, an oval, a circle and a diamond.

13. A radio frequency solenoid in accordance with claim 8, wherein the shape of said branches of said at least one solenoid turn separation portion is a trapezoid formed such that the two separated branches are of equal length.

* * * * *